US010365697B2

(12) United States Patent
Mundt et al.

(10) Patent No.: US 10,365,697 B2
(45) Date of Patent: Jul. 30, 2019

(54) HOT PLUG CARRIER WITH PUSH TO RELEASE MECHANISM

(71) Applicant: DELL PRODUCTS, LP, Round Rock, TX (US)

(72) Inventors: Kevin W. Mundt, Austin, TX (US); Gary B. Kotzur, Austin, TX (US); Taylor Mundt, Austin, TX (US)

(73) Assignee: Dell Products, LP, Round Rock, TX (US)

( * ) Notice: Subject to any disclaimer, the term of this patent is extended or adjusted under 35 U.S.C. 154(b) by 380 days.

(21) Appl. No.: 15/173,871

(22) Filed: Jun. 6, 2016

(65) Prior Publication Data

US 2017/0351304 A1 Dec. 7, 2017

(51) Int. Cl.
G06F 1/18 (2006.01)
H05K 7/14 (2006.01)
H05K 7/18 (2006.01)

(52) U.S. Cl.
CPC ............. *G06F 1/187* (2013.01); *G06F 1/183* (2013.01); *H05K 7/1474* (2013.01); *H05K 7/183* (2013.01); *Y10T 29/49025* (2015.01)

(58) Field of Classification Search
CPC ....... G06F 1/183; G06F 1/187; H05K 7/1474; H05K 7/183; Y10T 29/49025
See application file for complete search history.

(56) References Cited

U.S. PATENT DOCUMENTS

| 5,938,466 A | 8/1999 | Suzuki et al. |
| 8,397,787 B1 | 3/2013 | Daus et al. |
| 2004/0095716 A1* | 5/2004 | McAlister ............... G06F 1/187 361/679.33 |
| 2007/0064385 A1* | 3/2007 | Paul ....................... G06F 1/187 361/679.4 |
| 2010/0165564 A1* | 7/2010 | Lu .......................... G06F 1/187 361/679.35 |
| 2013/0207426 A1 | 8/2013 | Rølvag |

FOREIGN PATENT DOCUMENTS

| JP | 2017204318 A | * 11/2017 | ............. G06F 1/187 |
| WO | WO/2011/162619 A1 | 12/2011 | |

* cited by examiner

*Primary Examiner* — A. Dexter Tugbang
(74) *Attorney, Agent, or Firm* — Larson Newman, LLP (57) ABSTRACT

A drive carrier includes a latch wire, and a track that includes first and second segments. The latch wire is configured to move along a channel in the track to enable a handle of the drive carrier to transition between multiple positions within the track. The first segment is to be placed in physical communication with the latch wire while the latch wire is at a first position and a second position within the track. The second segment is in physical communication with the first segment. The second segment is to transition between a misaligned position and an aligned position with respect to the first segment, and the latch wire is to transition from the second position to a third position within the track in response to the second segment being in the aligned position.

14 Claims, 7 Drawing Sheets

HOT PLUG CARRIER WITH PUSH TO RELEASE MECHANISM

FIELD OF THE DISCLOSURE

This disclosure generally relates to information handling systems, and more particularly relates to a hot plug carrier with a push to release mechanism.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements can vary between different applications, information handling systems can also vary regarding what information is handled, how the information is handled, how much information is processed, stored, or communicated, and how quickly and efficiently the information can be processed, stored, or communicated. The variations in information handling systems allow for information handling systems to be general or configured for a specific user or specific use such as financial transaction processing, airline reservations, enterprise data storage, or global communications. In addition, information handling systems can include a variety of hardware and software components that can be configured to process, store, and communicate information and can include one or more computer systems, data storage systems, and networking systems.

SUMMARY

A drive carrier includes a latch wire, and a track that includes first and second segments. The latch wire moves along a channel in the track to enable a handle of the drive carrier to transition between multiple positions within the track. The first segment is in physical communication with the latch wire while the latch wire is at a first position and a second position within the track. The second segment is in physical communication with the first segment. The second segment transitions between a misaligned position and an aligned position with respect to the first segment, and the latch wire transitions from the second position to a third position within the track in response to the second segment being in the aligned position.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

FIGS. 1-14 illustrate a hot plug drive carrier 100 for one or more information handling systems. For purposes of this disclosure, the information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

Figure 1:
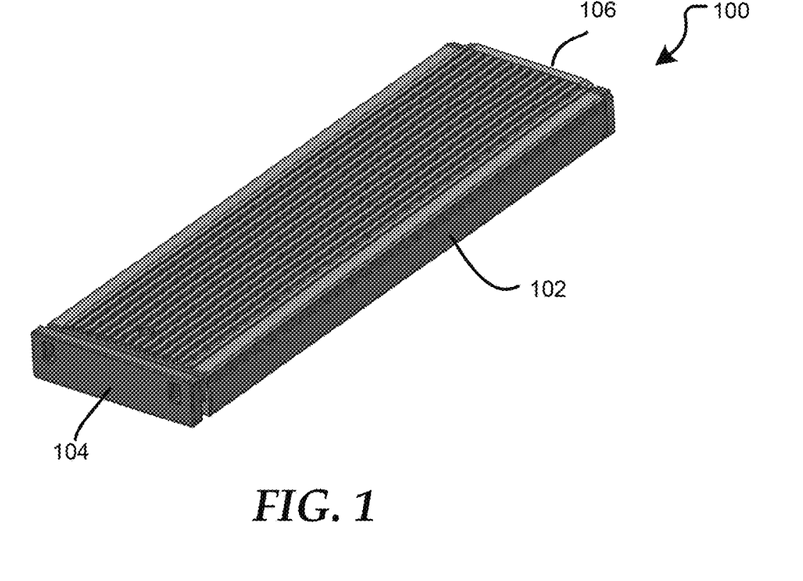
FIGS. 1 and 2 are perspective views illustrating external surfaces and components of a drive carrier in accordance with at least one embodiment of the present disclosure.
Figure 2:
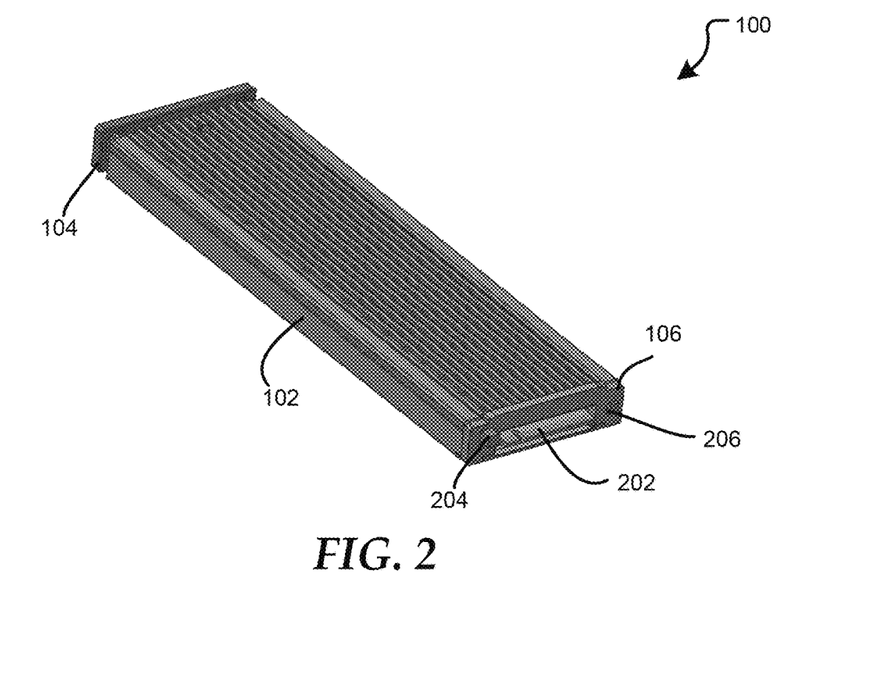
Figure 11:
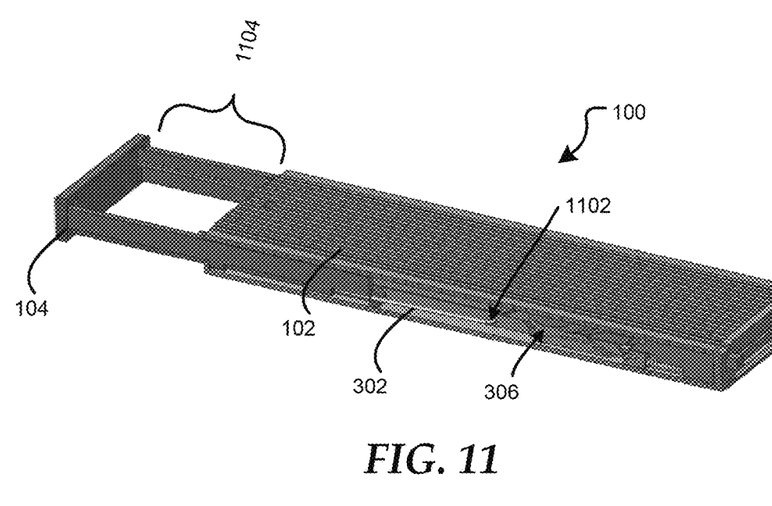
FIG. 11 is a perspective view of a handle of the drive carrier in an extended position in accordance with at least one embodiment of the present disclosure.
Figure 14:
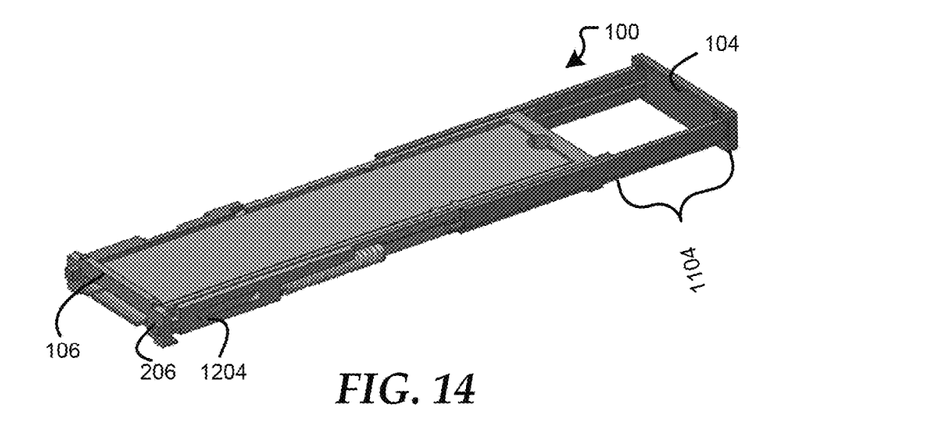

Referring to FIGS. 1 and 2, the drive carrier 100 includes an enclosure 102, a handle 104, a back panel 106, a connector 202, a tab 204, and a plunger 206. In an embodiment, the enclosure 102 surrounds a device, such as a M.2 device, or other form factors such as a three and a half inch drive, a two and a half inch drive, or the like. In an embodiment, the drive carrier 100 can support different form factor variants, for M.2 devices it would be different lengths, whereas for 3.5 and 2.5 inch drives and the like, different heights would be supported. In an embodiment, the drive carrier 100 can include a push-push mechanism to control whether the handle 104 is in a closed position, as shown in FIGS. 1 and 2, or in an extended position, as shown in FIGS. 11 and 14. The connector 202 extends from an opening of the back panel 106, such that the connector 202 can interconnect with a connector on a backplane of an information handling system.

Figure 3:
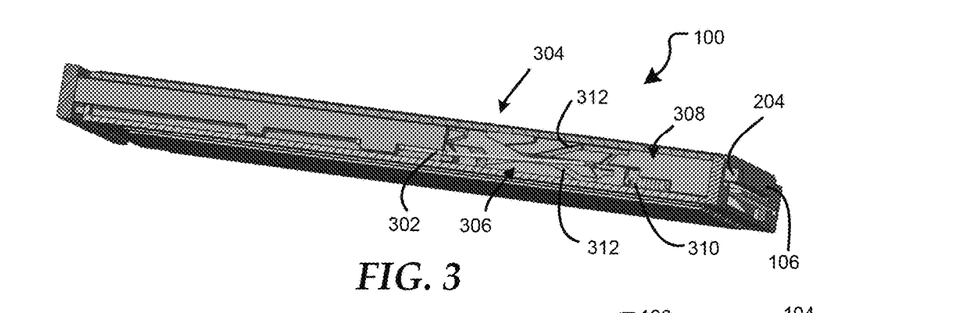
FIGS. 3-6 are perspective views of the drive carrier with a segment of a track in a misaligned position in accordance with at least one embodiment of the present disclosure.

FIGS. 3-6 illustrate different views of the drive carrier 100. Referring now to FIG. 3, the drive carrier 100 includes a latch wire 302 within a track 304, which in turn includes a first segment 306 and a second segment 308. In an embodiment, the first segment 306 is permanently fixed in a single location within the drive carrier 100 and the second segment 308 can slide within the drive carrier 100. A spring 310 is located between the first segment 306 and the second segment 308, and the spring 310 can exert a force on the second segment 308 to bias the second segment 308 in a misaligned position as shown in FIGS. 3-6. In an embodiment, while the second segment 308 is in the misaligned position, the tab 204 portion of the second segment 308 extends from the back panel 106 as shown in FIG. 3. The latch wire 302 includes a tip that is located and retained within a channel 312 of the track 304. In different embodiments, the latch wire 302 can be a tab, a plastic pin, or the like. In these embodiments, the tab or plastic pin can extend into the channel 312 of the track 304 and can move within the channel 312 as described for the latch wire 302 without varying from the scope of the disclosure. While the second segment 308 is in the misaligned position, a portion of the channel 312 located within the first segment 306 does not align with a portion of the channel 312 located within the second segment 308. Thus, the tip of the latch wire 302 cannot transition or move from the first segment 306 to the second segment 308 while the second segment 308 is in the misaligned position.

Figure 4:
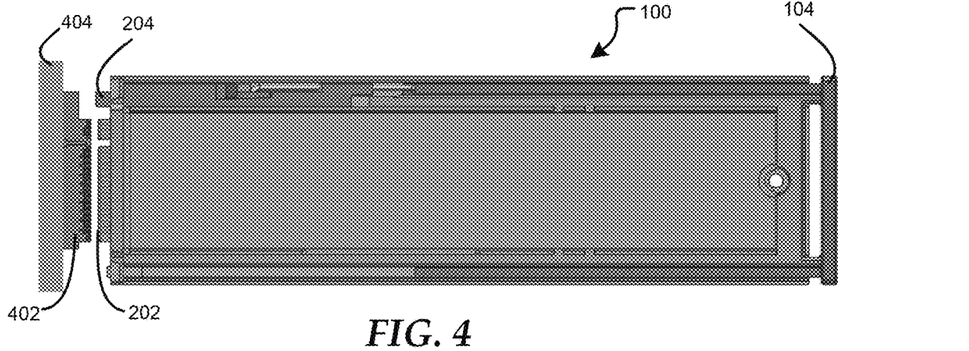

Referring now to FIG. 4, the drive carrier 100 can be inserted within an information handling system, such as information handling system 1600 of FIG. 16 below. During the insertion of the drive carrier, the connector 202 can align with a connector 402 of a backplane 404 within the information handling system 1600. The tab 204 can also align with a portion of the connector 402 as shown in FIG. 4.

Figure 5:
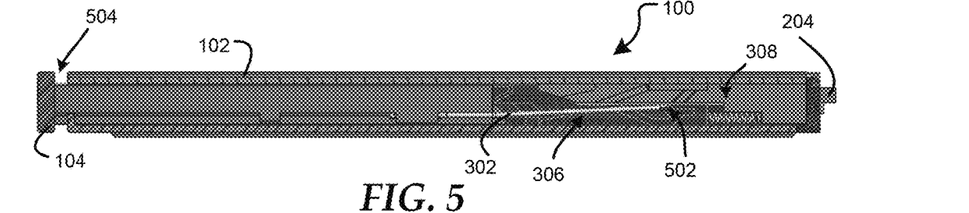
Figure 6:
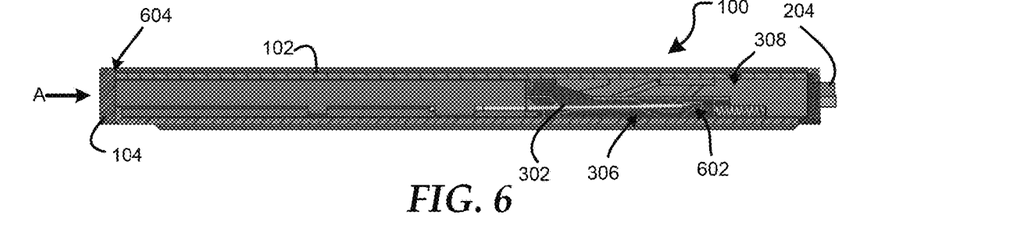
Figure 12:
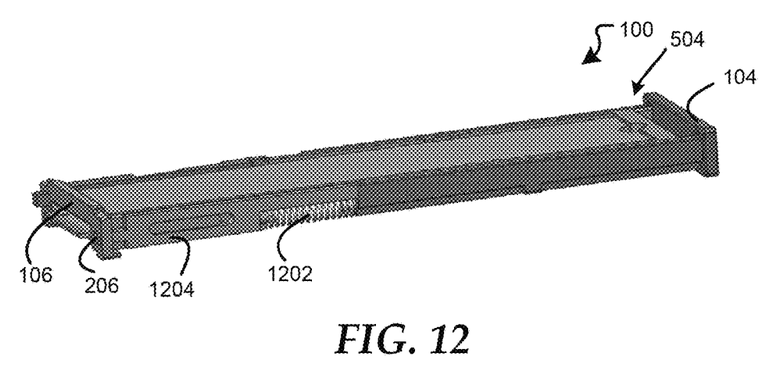
FIGS. 12-14 are perspective views of a plunger of the drive carrier in multiple position in accordance with at least one embodiment of the present disclosure.

Referring now to FIGS. 5 and 6, while the second segment 308 is in the misaligned position the tip of the latch wire 302 can transition between a first position 502, as shown in FIG. 5, and a second position 602, as shown in FIG. 6. When the handle 104 does not have a force exerted against it from outside of the drive carrier 100, the handle 104 is in a first closed position 504. While the handle 104 is in the first closed position 504, the tip of the latch wire 302 is located at the first position 502 within the channel 312 of the first segment 306. In an embodiment, the shape of the channel 312 at location 502 can retain the handle 104 in the first closed position 504 even though a spring 1202 of FIG. 12 is exerting a force on the handle 104 to move the handle away from the first closed position 502 as will be described in greater detail with respect to FIGS. 12-14 below. In response to a force being exerted against the handle 104, in the direction of arrow A of FIG. 6, the handle 104 can move to a second closed position 604 and the handle 104 can be forced against the enclosure 102 of the drive carrier 100.

While the handle 104 is in the second closed position 604, the handle 104 can force the latch wire 302 to transition from the first position 502 to the second position 602 because the misalignment between the portion of the channel 312 in the first segment 306 with the portion of the channel 312 in the second segment 308 can prevent the latch wire 302 from transitioning from the first position 502 to a position within the second segment 308. Thus, while the drive carrier 100 is being pushed into the information handling system by the force being exerted on the handle 104, the latch wire 302 can only transition between the first position 502 and the second position 602 based on the misaligned between the first segment 306 and the second segment 308.

Figure 7:
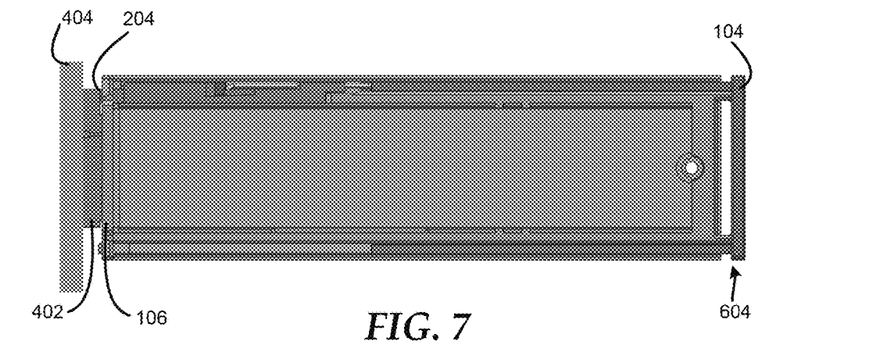
FIGS. 7-10 are perspective views of the drive carrier with the segment of the track in an aligned position in accordance with at least one embodiment of the present disclosure.
Figure 8:
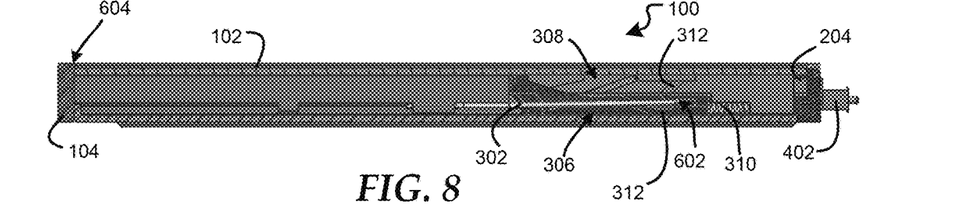

FIGS. 7-10 illustrate different views of the drive carrier 100 while the second segment 308 is aligned with the first segment 306 in accordance with at least one embodiment of the present disclosure. Referring now to FIG. 7, while the handle 104 is held in the second closed position 604 in response to the force pushing the drive carrier 100 within the information handling system, the tab 204 can be placed in physical communication with the connector 402 of the backplane 404. In this situation, physical communication with the connector 402 can force the tab 204 within the back panel 106 of the drive carrier 100 while the connector 202 is fully coupled to the connector 402. The movement of the tab 204 within the back panel 106 can cause the spring 310 to compress and exert a force against the second segment 308 to place the second segment 308 in an aligned position with respect to the first segment 306 as shown in FIG. 8.

Referring now to FIG. 8, the portions of the channel 312 of the track 304 can align between the first segment 306 and the second segment 308 while the second segment is in the aligned position. While the handle 104 is still in the second closed position 604 and the tab 204 is forced within the back panel 106 by the connector 402, the segments 306 and 308 can be in the aligned position and the latch wire 302 can still remain in the second position 602. However, when the force is no longer exerted against the handle 104, the handle 104 can transition back to the first closed position 504 and the latch wire 302 can transition to the first position 502 within the first segment 306 as shown in FIG. 9.

Figure 9:
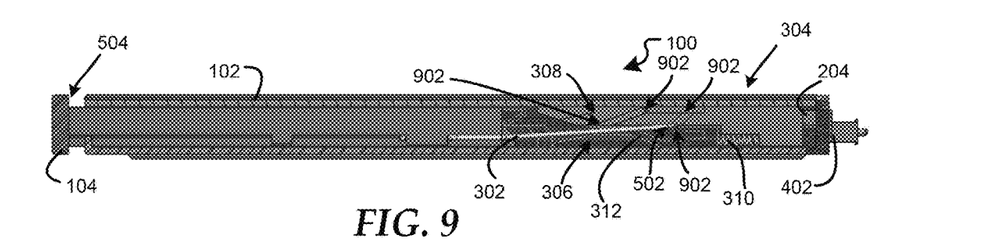

Referring to FIG. 9, the track 304 can include one or more latches or steps 902 within the channel 312. The steps 902 can prevent the latch wire 302 from moving back to a previous position after the latch wire 302 has crossed one of the steps 902 while transitioning between positions. In an embodiment, channel 312 is lower on one side of a step 902 as compared to the other. For example, a step 902 can be located between the first position 502 and a third position 1002, shown in FIG. 10. The step 902 can prevent the latch wire 302 from moving from the third position 1002 back to the first position 502. Thus, the steps 902 can ensure that the latch wire 302 only moves in a single direction around the channel 312 of the track 304.

Figure 10:
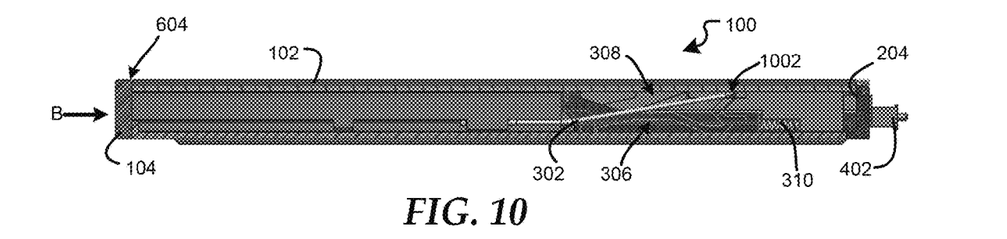

Referring now to FIG. 10, a force can be exerted on the handle 104 in the direction of arrow B while the second segment is in the aligned position. In this situation, the latch wire 302 can transition from the first position 502 in the first segment 306 to the third position 1002 of the second segment 308, and the step 902 in the second segment 308 can prevent the latch wire 302 from moving back to the first position 502 when the force is removed from the handle 104. Instead, the latch wire 302 can move along the channel 312 within the second segment 308 until the latch wire 302 is placed in a fourth position 1102 within the first segment 306 as shown in FIG. 11.

FIG. 11 illustrates the handle 104 of the drive carrier 100 in an extended position 1104 in accordance with at least one embodiment of the present disclosure. As shown in FIG. 11, the latch wire 302 has transitioned to the fourth position 1102 within the first segment 306, such that the latch wire 302 is no longer holding the handle 104 in the second closed position 602, shown in FIG. 10, but has enabled the handle 104 to move to the extended position 1104. In this situation, a user can place his or her finger within the opening formed between the enclosure 102 and the opening 104, such that the user can pull the drive carrier 100 out of the information handling system by the handle 104.

Figure 13:
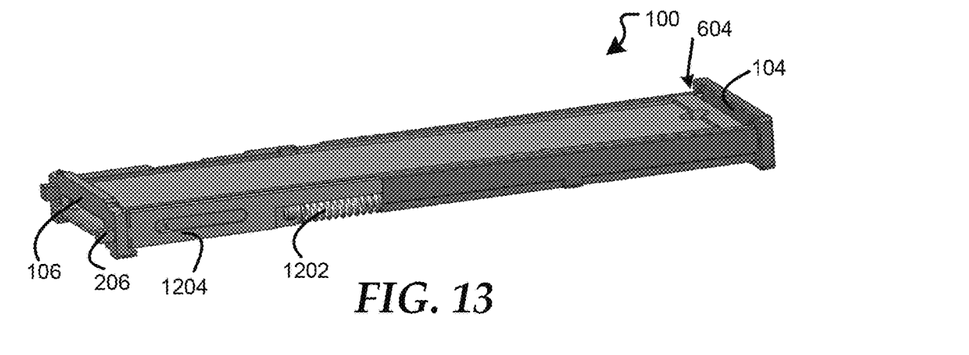

FIGS. 12-14 illustrate different positions of the plunger 206 of the drive carrier 100 as the drive carrier 100 is ejected from an information handling system in accordance with at least one embodiment of the present disclosure. Referring now to FIG. 12, the plunger 206 is a portion of a component 1204 that can be placed within or can extend from the back panel 106. In an embodiment, the component 1204 can be biased to hold the plunger 206 within the back panel 106. The spring 1204 is located between a portion of the handle 104 and the drive carrier 100 to exert a force on the handle to bias the handle 104 in the extended position 1104. However, as discussed above the latch wire 302 can be located within the first position 502 of the channel 312 to prevent the handle 104 from moving to the extended position 1104. In the first closed position 504, the handle 104 does not exert a force on the component 1204, such that the plunger 206 remains within the back panel 106.

However, referring now to FIG. 13, when the handle is forced into the second closed position 604, the spring 1202 is compressed and the handle 104 can exert a force on the component 1204, which in turn can force the plunger 206 to extend from back panel 106. In this situation, the extension of the plunger 206 can cause the plunger 206 to press a tact switch button on the backplane 404, shown in FIGS. 4 and 7, of the information handling system. In an embodiment, the pressing of the tact switch can cause a peripheral component interconnect express (PCIe) notification that a storage device within the drive carrier 100 is about to be removed from the information handling system. In an alternative embodiment to eliminate the tact switch, the connector 402 of the backplane 404, or the backplane 404 itself, can include signal pins, and the plunger 206 can include a metal cap. In this embodiment, the extension of the plunger 206 can cause the metal cap to contact the signal pins on the connector 402 or backplane 404, and the contact between the metal cap and the signal pins can cause the PCIe notification to be sent. In an embodiment, the PCIe notification can be sent to a processor, such as a central processing unit 1602 of FIG. 16, within the information handling system via a PCI bus 1608 of FIG. 16. Referring now to FIG. 14, in response to the force being removed from the handle 104, the handle 104 can transition to the extended position 1104 and the component 1204 can return to its biased position, such that the plunger 206 is placed within the back panel 106.

Figure 15:
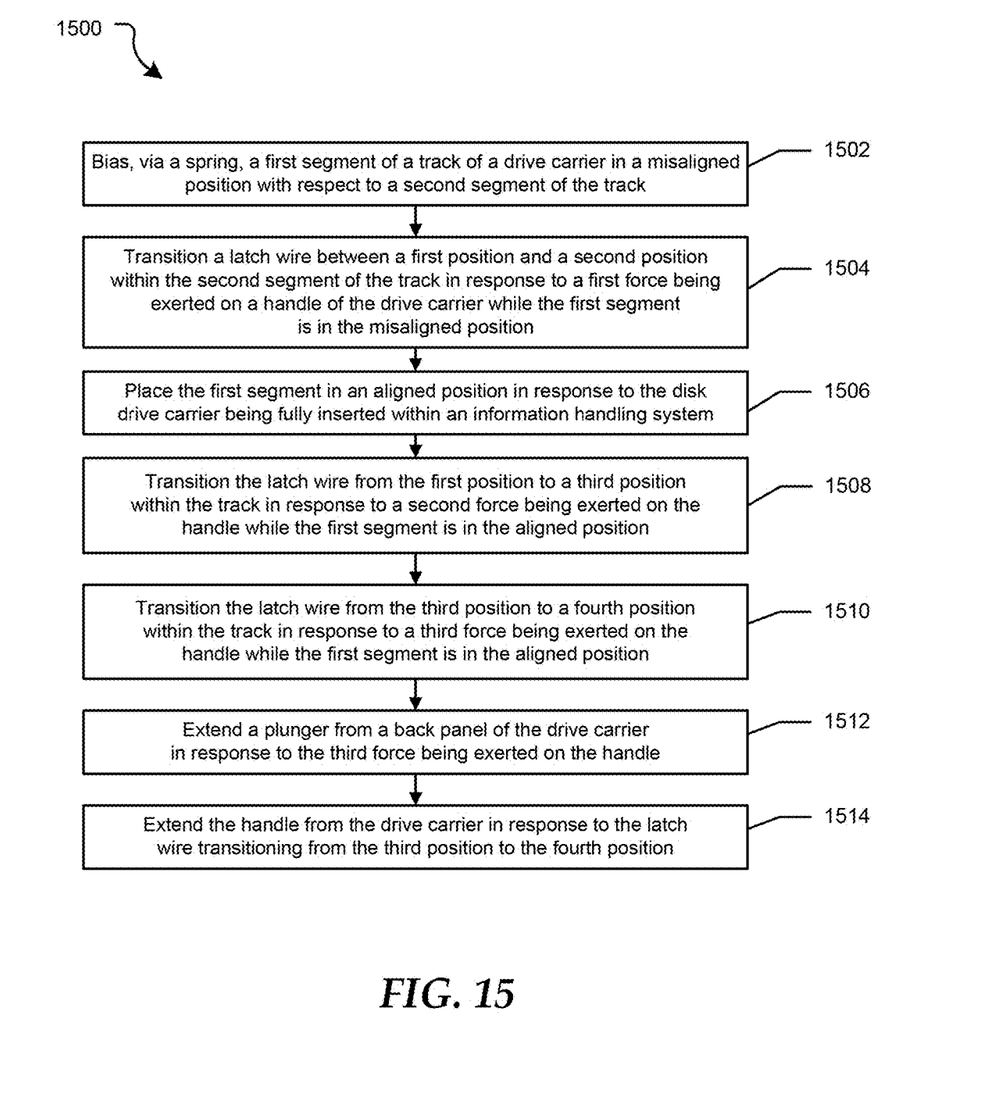
FIG. 15 is a flow diagram of a method for operating the drive carrier in accordance with at least one embodiment of the present disclosure.

FIG. 15 is a flow diagram of a method 1500 for operating the drive carrier 100 in accordance with at least one embodiment of the present disclosure. At block 1502, a first segment of a track of the drive carrier is biased in a misaligned position with respect to a second segment of the track. In an embodiment, the first segment is biased in the misaligned position by a spring in physical communication with the first segment and a back panel of the drive carrier. In an embodiment, the misaligned position causes the track from not being continuous from the first segment to the second segment. A latch wire is transitioned between a first position and a second position within the second segment in response to a first force being exerted on a handle of the drive carrier while the first segment is in the misaligned position at block 1504. In an embodiment, the latch wire is prevented from transitioning from the first position to a third position while the first segment is in the misaligned position.

At block 1506, the first segment is placed in an aligned position in response to the storage device being fully inserted within an information handling system. In an embodiment, the aligned position of the first segment causes the track to be continuous from the first segment to the second segment. In an embodiment, the first segment is placed in the aligned position based on a tab of the first segment being placed in physical communication with a connector on a backplane of the information handling system, and the tab being pressed within the back panel of the drive carrier. In an embodiment, the tab is connected to the first segment, such that the movement of the tab causes the first segment to move into the aligned position. The latch wire is transitioned from the first position to a third position within the track in response to a second force being exerted on the handle while the first segment is in the aligned position at block 1508.

At block 1510, the latch wire is transitioned from the third position to a fourth position within the track in response to a third force being exerted on the handle while the first segment is in the aligned position. In an embodiment, the track includes catches or steps that cause the latch wire to only move in one direction around the track. A plunger is extended from a back panel of the drive carrier in response to the third force being exerted on the handle at block 1512. In an embodiment, extension of the plunger can cause the plunger to press a tact switch button on a backplane of the information handling system, which in turn can cause a PCIe notification that the storage device within the drive carrier is about to be removed from the information handling system. At block 1514, the handle is extended from the drive carrier in response to the latch wire transitioning from the third position to the fourth position. In an embodiment, the user can insert his or her finger within an opening between the handle and the drive carrier in response to the handle being extended.

Figure 16:
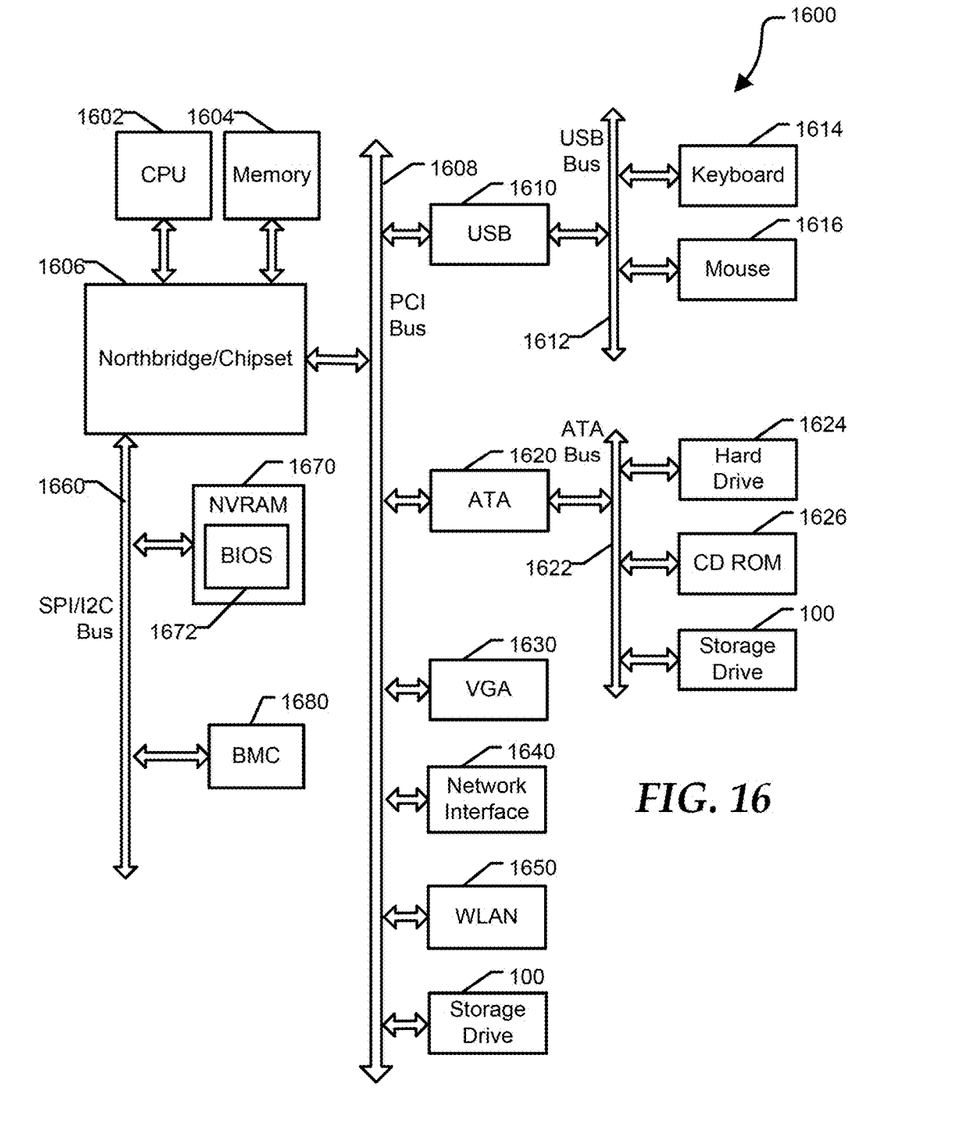
FIG. 16 is a block diagram of a general information handling system.

FIG. 16 shows an information handling system 1600 including a processor 1602, a memory 1604, a northbridge/chipset 1606, a PCI bus 1608, a universal serial bus (USB) controller 1610, a USB 1612, a keyboard device controller 1614, a mouse device controller 1616, a configuration an ATA bus controller 1620, an ATA bus 1622, a hard drive device controller 1624, a compact disk read only memory (CD ROM) device controller 1626, the drive carrier 100 of FIG. 1, a video graphics array (VGA) device controller 1630, a network interface controller (NIC) 1640, a wireless local area network (WLAN) controller 1650, a serial peripheral interface (SPI) bus 1660, a NVRAM 1670 for storing BIOS 1672, and a baseboard management controller (BMC) 1680. In an embodiment, the drive carrier 100 can be connected to the information handling system 1600 in multiple locations depending on the type of device within the drive carrier 100. For example, the drive carrier 100 can coupled the device to the PCI bus 1608, to the ATA bus 1622, or the like. BMC 1680 can be referred to as a service processor or embedded controller (EC). Capabilities and functions provided by BMC 1680 can vary considerably based on the type of information handling system. For example, the term baseboard management system is often used to describe an embedded processor included at a server, while an embedded controller is more likely to be found in a consumer-level device. As disclosed herein, BMC 1680 represents a processing device different from CPU 1602, which provides various management functions for information handling system 1600. For example, an embedded controller may be responsible for power management, cooling management, and the like. An embedded controller included at a data storage system can be referred to as a storage enclosure processor.

For purpose of this disclosure information handling system 1600 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 1600 can be a personal computer, a laptop computer, a smart phone, a tablet device or other consumer electronic device, a network server, a network storage device, a switch, a router, or another network communication device, or any other suitable device and may vary in size, shape, performance, functionality, and price. Further, information handling system 1600 can include processing resources for executing machine-executable code, such as CPU 1602, a programmable logic array (PLA), an embedded device such as a System-on-a-Chip (SoC), or other control logic hardware. Information handling system 1600 can also include one or more computer-readable medium for storing machine-executable code, such as software or data.

System 1600 can include additional processors that are configured to provide localized or specific control functions, such as a battery management controller. Bus 1660 can include one or more busses, including a SPI bus, an I2C bus, a system management bus (SMBUS), a power management bus (PMBUS), and the like. BMC 1680 can be configured to provide out-of-band access to devices at information handling system 1600. As used herein, out-of-band access herein refers to operations performed prior to execution of BIOS 1672 by processor 1602 to initialize operation of system 1600.

BIOS 1672 can be referred to as a firmware image, and the term BIOS is herein used interchangeably with the term firmware image, or simply firmware. BIOS 1672 includes instructions executable by CPU 1602 to initialize and test the hardware components of system 1600, and to load a boot loader or an operating system (OS) from a mass storage device. BIOS 1672 additionally provides an abstraction layer for the hardware, i.e. a consistent way for application programs and operating systems to interact with the keyboard, display, and other input/output devices. When power is first applied to information handling system 1600, the system begins a sequence of initialization procedures. During the initialization sequence, also referred to as a boot sequence, components of system 1600 are configured and enabled for operation, and device drivers can be installed. Device drivers provide an interface through which other components of the system 1600 can communicate with a corresponding device.

Information handling system 1600 can include additional components and additional busses, not shown for clarity. For example, system 1600 can include multiple processor cores, audio devices, and the like. While a particular arrangement of bus technologies and interconnections is illustrated for the purpose of example, one of skill will appreciate that the techniques disclosed herein are applicable to other system architectures. System 1600 can include multiple CPUs and redundant bus controllers. One or more components can be integrated together. For example, portions of northbridge/chipset 1606 can be integrated within CPU 1602. Additional components of information handling system 1600 can include one or more storage devices that can store machine-executable code, one or more communications ports for communicating with external devices, and the like. An example of information handling system 1600 includes a multi-tenant chassis system where groups of tenants (users) share a common chassis, and each of the tenants has a unique set of resources assigned to them. The resources can include blade servers of the chassis, input/output (I/O) modules, Peripheral Component Interconnect-Express (PCIe) cards, storage controllers, and the like.

Information handling system 1600 can include a set of instructions that can be executed to cause the information handling system to perform any one or more of the methods or computer based functions disclosed herein. The information handling system 1600 may operate as a standalone device or may be connected to other computer systems or peripheral devices, such as by a network.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. In a networked deployment, the information handling system 1600 may operate in the capacity of a server or as a client user computer in a server-client user network environment, or as a peer computer system in a peer-to-peer (or distributed) network environment. The information handling system 1600 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 1600 can be implemented using electronic devices that provide voice, video or data communication. Further, while a single information handling system 1600 is illustrated, the term "system" shall also be taken to include any collection of systems or sub-systems that individually or jointly execute a set, or multiple sets, of instructions to perform one or more computer functions.

The information handling system 1600 can include a disk drive unit and may include a computer-readable medium, not shown in FIG. 16, in which one or more sets of instructions, such as software, can be embedded. Further, the instructions may embody one or more of the methods or logic as described herein. In a particular embodiment, the instructions may reside completely, or at least partially, within system memory 1604 or another memory included at system 1600, and/or within the processor 1602 during execution by the information handling system 1600. The system memory 1604 and the processor 1602 also may include computer-readable media.

In an alternative embodiment, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions or receives and executes instructions responsive to a propagated signal; so that a device connected to a network can communicate voice, video or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories.

Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A drive carrier comprising:
   a latch wire movable along a channel in a track to enable a handle of the drive carrier to transition between multiple positions;
   a first segment of the track disposed in physical communication with the latch wire while the latch wire is at a first position and a second position within the track; and
   a second segment of the track in physical communication with the first segment, the second segment to transition between a misaligned position and an aligned position with respect to the first segment, the latch wire to transition from the second position to a third position within the track in response to the second segment being in the aligned position;
   the handle in physical communication with the latch wire, the handle to transition from a first closed position to a second closed position in response to a first force being exerted on the handle in a direction of a back panel of the drive carrier; and
   the handle to exert a second force on the latch wire in response to the handle transitioning from the first closed position to the second closed position, the second force to cause the latch wire to move from the second position to the third position.

2. The drive carrier of claim 1 further comprising:
   a tab in physical communication with the second segment, the tab to place the second segment in the aligned position in response to the drive carrier being placed in a fully inserted position within an information handling system.

3. The drive carrier of claim 2 wherein a back panel of the drive carrier is in physical communication with a connector of a backplane of the information handling system when the drive carrier is in the fully inserted position.

4. The drive carrier of claim 1 further comprising:
   a spring in physical communication with the second segment, the spring to bias the second segment in the misaligned position.

5. The drive carrier of claim 1 further comprising:
   a spring in physical communication with the handle, the spring to exert the second force on the handle after the first force is released, the second force to cause the latch wire to move from the third position to a fourth position within the track, and to cause the handle to transition from the second closed position to an extended position.

6. A drive carrier comprising:
   a handle usable during insertion and removal of the drive carrier within an information handling system, the handle to be held in a closed position while the drive carrier is being inserted into the information handling system and to be in an extended position when the drive carrier is being removed from the information handling system;
   a latch wire in physical communication with the handle, the latch wire to move along a channel in a track to enable the handle to transition between multiple positions;
   a first segment of the track to be placed in physical communication with the latch wire while the latch wire is at a first position and a second position within the track; and
   a second segment of the track in physical communication with the first segment, the second segment to transition between a misaligned position and an aligned position with respect to the first segment, the latch wire to transition from the second position to a third position within the track in response to the second segment being in the aligned position;
   the handle to exert a force on the latch wire in response to the handle transitioning from a first closed position to a second closed position, the force to cause the latch wire to move from the second position to the third position.

7. The drive carrier of claim 6 further comprising:
   a tab in physical communication with the second segment, the tab to place the second segment in the aligned position in response to the drive carrier being placed in a fully inserted position within the information handling system.

8. The drive carrier of claim 7 wherein a back panel of the drive carrier is in physical communication with a connector of a backplane of the information handling system when the drive carrier is in the fully inserted position.

9. The drive carrier of claim 6 further comprising:
a spring in physical communication with the second segment, the spring to bias the second segment in the misaligned position.

10. The drive carrier of claim 6 further comprising:
a spring in physical communication with the handle, the spring to exert the force on the handle, the force to cause the latch wire to move from the third position to a fourth position within the track, and to cause the handle to transition from the closed position to the extended position.

11. A drive carrier comprising:
a handle usable during insertion and removal of the drive carrier within an information handling system, the handle to be held in a closed position while the drive carrier is being inserted into the information handling system and to be in an extended position when the drive carrier is being removed from the information handling system;
a latch wire in physical communication with the handle, the latch wire to move along a channel in a track to enable the handle to transition between multiple positions;
a first segment of the track to be placed in physical communication with the latch wire while the latch wire is at a first position and a second position within the track;
a second segment of the track in physical communication with the first segment, the second segment to transition between a misaligned position and an aligned position with respect to the first segment, the latch wire to transition from the second position to a third position within the track in response to the second segment being in the aligned position; and
a spring in physical communication with the handle, the spring to exert a force on the handle, the force to cause the latch wire to move from the third position to a fourth position within the track, and to cause the handle to transition from the closed position to the extended position.

12. The drive carrier of claim 11 further comprising:
a tab in physical communication with the second segment, the tab to place the second segment in the aligned position in response to the drive carrier being placed in a fully inserted position within the information handling system.

13. The drive carrier of claim 11 wherein a back panel of the drive carrier is in physical communication with a connector of a backplane of the information handling system when the drive carrier is in the fully inserted position.

14. The drive carrier of claim 11 wherein the handle exerts a second force on the latch wire in response to the handle transitioning from a first closed position to a second closed position, the second force to cause the latch wire to move from the second position to the third position.

* * * * *